(12) United States Patent
Kim et al.

(10) Patent No.: US 7,930,465 B2
(45) Date of Patent: Apr. 19, 2011

(54) DETERMINING OPERATION MODE FOR SEMICONDUCTOR MEMORY DEVICE

(75) Inventors: Seok-Il Kim, Seoul (KR); Young-Man Ahn, Gyeonggi-do (KR); Byung-Se So, Gyeonggi-do (KR); Seung-Jin Seo, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 346 days.

(21) Appl. No.: 11/256,580

(22) Filed: Oct. 21, 2005

(65) Prior Publication Data

US 2006/0098513 A1    May 11, 2006

(30) Foreign Application Priority Data

Oct. 22, 2004   (KR) ................. 10-2004-0084728

(51) Int. Cl.
   *G06F 12/00*   (2006.01)
(52) U.S. Cl. ....... 711/5; 711/105; 711/154; 365/165.11; 365/230.01
(58) Field of Classification Search .............. 711/5, 105, 711/154; 365/185.11, 230.01
   See application file for complete search history.

(56) References Cited

U.S. PATENT DOCUMENTS

| | | | |
|---|---|---|---|
| 6,426,560 B1 * | 7/2002 | Kawamura et al. | 257/777 |
| 2002/0008509 A1 * | 1/2002 | Kang | 324/200 |
| 2002/0194446 A1 * | 12/2002 | Takeda | 711/167 |
| 2003/0198098 A1 * | 10/2003 | Fujioka et al. | 365/200 |
| 2003/0209790 A1 * | 11/2003 | Matsumoto et al. | 257/678 |
| 2003/0235090 A1 * | 12/2003 | Lee et al. | 365/200 |
| 2003/0235107 A1 * | 12/2003 | Jang | 365/233 |
| 2008/0028129 A1 * | 1/2008 | Nakanishi et al. | 711/103 |

FOREIGN PATENT DOCUMENTS

| | | |
|---|---|---|
| JP | 09-198897 | 7/1997 |
| JP | 2003-007058 | 1/2003 |
| KR | 2001-0065148 | 7/2001 |

OTHER PUBLICATIONS

English language abstract of Korean Publication No. 2001-0065148.
English language abstract of Japanese Publication No. 09-198897.
English language abstract of Japanese Publication No. 2003-007058.

* cited by examiner

*Primary Examiner* — Jared I Rutz
*Assistant Examiner* — Matthew Bradley
(74) *Attorney, Agent, or Firm* — Harness, Dickey & Pierce, P.L.C.

(57) ABSTRACT

A semiconductor memory device capable of determining an operation mode by using states of data pins, and an operation mode determining method for the same are disclosed. The semiconductor memory device includes at least one MRS input pad, at least one data input pad, and an operation mode determining circuit. The operation mode determining circuit generates an operation mode determining signal, when an MRS command input through the MRS input pad corresponds to a predetermined MRS command and data signals input through the data input pad or pads include a predetermined combination. Accordingly, the efficiency in the manufacturing and producing processes may be improved by determining the operation mode of the semiconductor memory device in a module assembly process.

18 Claims, 8 Drawing Sheets

FIG. 4

| | OPERATION MODE | B1 | B9 | D1 | D9 |
|---|---|---|---|---|---|
| 410 | | | | | |
| 420 | x4 | VDD | GND | VDD | GND |
| 430 | x8 | DQ6 | DQ7 | DQ4 | DQ5 |

DETERMINING OPERATION MODE FOR SEMICONDUCTOR MEMORY DEVICE

CROSS REFERENCE TO RELATED APPLICATIONS

This application relies for priority upon Korean Patent Application No. 2004-84728 filed on Oct. 22, 2004, the contents of which are herein incorporated by reference in its entirety.

BACKGROUND OF THE INVENTION

1. Field of the Invention

The present invention relates to a semiconductor memory device, and more particularly, to a semiconductor memory device capable of determining an operation mode using data pin signals so as to improve an efficiency of the manufacturing and producing process, and an operation mode determining method for the same.

2. Description of the Related Art

In a manufacturing process of a semiconductor memory device, it is desirable that a kind of the semiconductor memory device as a final product be determined in a latter stage of the manufacturing process.

The reason for this is that as the specific kinds of the product are determined later, more operations can be commonly shared in manufacturing various kinds of products. Such approach to process sharing has especial significance in manufacturing the semiconductor memory device. In manufacturing the semiconductor memory device based on a few items/mass production, the efficiency of the manufacturing process can be a crucial factor for competitiveness among manufacturers.

One important specification of the semiconductor memory device is a bit organization. The bit organization may be expressed by x1, x4, x8, etc. This expression represents the number of memory cells selected by one address.

That is, the bit organization represents the number of memory cells that are simultaneously read or written on by one addressing. For example, in the case of an x4 organization, four memory cells are accessed and four bit data are outputted in response to one address input signal.

Semiconductor memory devices having the same capacity may have different bit configurations. Accordingly, a 16M DRAM (dynamic random access memory) may have different bit organizations, for example, 16M×1, 4M×1, 2M×8, etc. The 16M×1 organization indicates that the semiconductor memory device has 16M number of 1-bit cells, and the 4M×1 organization indicates that the semiconductor memory device has 4M number of 4-bit cells. Further, the 2M×8 organization indicates that the semiconductor memory device has 2M number of 8-bit cells.

The semiconductor memory device can be expressed by an operation mode from a viewpoint of the bit organization representing the number of memory cells that are simultaneously read or written by one addressing. Therefore, it should be noted that the expression of the bit organization may be used herein as an alternative for the expression of the operation mode.

The x16, further x32, organization is used for a semiconductor memory device having high data bandwidth for the fields requiring high performance, for example, a graphic field. The x8 and x4 organizations are widely used in PC systems and server systems.

In addition, the x1, x4 and x8 operation modes of the semiconductor memory device determine how many data pins the semiconductor device package will have. As described above, the x1 operation mode can have one data input/output pin or two data pins in which a data-in pin and a data-out pin are separated. The x4 operation mode has four data pins and the x8 operation mode has eight data pins.

Conventionally, however, the DRAM does not have the above-described bit organization at a wafer level during its manufacturing process, and the DRAM is assembled in the x4 or x8 bit organization during a packaging process.

Additionally, in some applications, e.g., PC system, the semiconductor memory devices are produced in a module architecture, in which the semiconductor memory devices are integrated on one printed circuit board (PCB), and the memory modules are mounted in respective slots of the systems.

Among a variety of types of the memory modules, a Dual In-line Memory Module (DIMM) is widely used. The DIMM can have various shapes and sizes, and a 168-pin, 184-pin or 240-pin DIMM are available.

The 184-pin configuration DIMM has widespread use for the memory module. Because the 184-pin DIMM has perfect, or near perfect x64 data buses, data may be transmitted with 64-bit data bandwidth. Therefore, the 184-pin DIMM is used as main memory in Pentium or higher class desktop systems or server systems.

As described above, one DIMM can have the x64 organization at the module level. In this case, sixteen x4 DRAMs or eight x8 DRAMs are mounted on one module. Alternatively, one module can have an x72 organization at the module level. In this case, the additional eight bits of the x72 DIMM may be used to control data buses and check partial bit error.

FIG. 1 is a diagram illustrating a manufacturing process of conventional semiconductor memory devices with x8 and x4 organizations.

The manufacturing process and modulization process of the above-described semiconductor memory device is described below with reference to FIG. 1.

Before step S110 for a packaging process, the semiconductor memory devices exist at a wafer level 100 through common manufacturing processes without differentiating the x4 and x8 organizations. That is, prior to performing the step S110 of packaging the semiconductor memory device, all the semiconductor memory devices are manufactured in the x8 organization.

After the packaging step S110, the semiconductor memory devices having no difference in the wafer level 100 are classified into x8 memory devices 111 and x4 memory devices 112. Generally, in the packaging step S110, the semiconductor memory devices are differential or classified through a pad bonding.

After the semiconductor memory devices are classified into the x8 memory devices 111 and the x4 memory devices 114 in the packaging step S110, the process proceeds to steps S120a and S120b of verifying the semiconductor memory devices through test operations that are suitable for the respective organizations of the semiconductor memory devices. In these steps, according to test programs suitable for the respective organizations of the semiconductor memory devices, some parts of the test operations need to be separated.

In steps S130a and S130b, the tested semiconductor memory devices are assembled into memory modules according to their organizations, respectively.

When considering that productivity is enhanced as the specific kinds of the products are determined in the latter stage of the manufacturing process as described above, the above manufacturing process should be modified.

In the conventional art, the steps of assembling the memory module are not considered to be part of the above manufacturing process. Steps prior to the step S110 for packaging are considered to be the manufacturing process. However, the current trend is to manufacture the semiconductor memory device as a memory module, not a single product.

A Korean Patent Laid-Open Publication No. 2001-0065148 discloses an operating mode selecting circuit for determining an operation mode according to a bit organization of a semiconductor memory device by using an anti-fuse device after a packaging process. According to the publication, however, the operation mode selecting circuit merely programs the semiconductor memory device by using the anti-fuse device after the packaging process.

Accordingly, there exists a need for an operation of programming the semiconductor memory device through a separated test operation after the packaging process.

SUMMARY OF THE INVENTION

Accordingly, the present invention is provided to substantially obviate one or more problems due to limitations and disadvantages of the related art.

One aspect of the invention provides a semiconductor memory device that is capable of determining an operation mode by using an MRS signal and a data pin signal together, thereby improving an efficiency in manufacturing and producing processes.

Another aspect of the present invention provides an operation mode determining method of the above semiconductor memory device.

A further aspect of the invention provides a memory module into which the above semiconductor memory device is assembled.

In an example embodiment, a semiconductor memory device includes at least one MRS input pad; at least one data input pad; and an operation mode determining circuit configured to generate an operation mode determining signal in response to an MRS command input through the MRS input pad and data signals input through the at least one data input pad. When the input MRS command corresponds to a predetermined MRS command and the input data signals include a predetermined combination, the operation mode determining circuit generates the operation mode determining signal for determining an operation mode of the semiconductor memory device that represents a number of memory cells selected by an address.

In another example embodiment, a semiconductor memory device includes at least one MRS input pad configured to receive an MRS command; at least one data input pad configured to receive data signals; a counter; and an operation mode determining circuit configured to generate an operation mode determining signal based on an MRS command input through the MRS input pad and a data signal input through the at least one data input pad. When the input MRS command corresponds to a predetermined MRS command and the input data signals include a predetermined combination, the operation mode determining circuit increments a count value of the counter in response to the input MRS command and the input data signal, and generates the operation mode determining signal for determining an operation mode of the semiconductor memory device that represents a number of memory cells selected by an address, when the count value of the counter reaches to a predetermined threshold value.

The predetermined MRS command may include any types of typical MRS commands provided to the semiconductor memory device, or a part of the MRS commands.

In the case in which the semiconductor memory device has $2^N$ number of data input pads (where N is a positive integer), whether the operation mode of the semiconductor memory device is $\times 2^P$ (where P is a positive integer less than N) operation mode is determined by a predetermined combination of the data signals input through the at least one data input pad except for $2^P$ number of the data input pads necessary for the $\times 2^P$ operation mode among the $2^N$ number of the data input pads.

In still another example embodiment, an operation mode determining method for a semiconductor memory device includes receiving an MRS command; receiving data signals; determining whether a received MRS command corresponds to a predetermined MRS command; determining whether received data signals include a predetermined combination when the input MRS command corresponds to the predetermined MRS command; and determining an operation mode of the semiconductor memory device that represents a number of memory cells selected by an address when the received data signals include the predetermined combination.

In still another example embodiment, an operation mode determining method for a semiconductor memory device includes receiving an MRS command; receiving data signals; determining whether a received MRS command corresponds to a predetermined MRS command; determining whether received data signals include a predetermined combination when the input MRS command corresponds to the predetermined MRS command; incrementing a count value of a counter when the input data signals include the predetermined combination; and determining an operation mode of the semiconductor memory device that represents a number of memory cells selected by an address when the count value of the counter reaches a predetermined threshold value.

In still another embodiment, a semiconductor memory module includes at least one MRS input pad; at least one data input pad; and an operation mode determining circuit configured to generate an operation mode determining signal based on the input MRS command and the input data signals. When the input MRS command corresponds to a predetermined MRS command and the input data signals include a predetermined combination, the operation mode determining circuit generates the operation mode determining signal for determining an operation mode of a semiconductor memory device that represents a number of memory cells selected by an address.

The predetermined MRS command received by the semiconductor memory device may include any types of typical MRS commands input to the semiconductor memory device, or a part of the MRS commands.

In still another embodiment, a semiconductor memory module includes at least one MRS input pad configured to receive an MRS command; at least one data input pad configured to receive data signals; a counter; and an operation mode determining circuit configured to generate an operation mode determining signal based on the input MRS command and the input data signal. When the input MRS command corresponds to a predetermined MRS command and the input data signals include a predetermined combination, the operation mode determining circuit increments a count value of the counter, and generates the operation mode determining signal for determining an operation mode of the semiconductor memory device that represents a number of memory cells selected by an address when the count value of the counter reaches a predetermined threshold value.

The predetermined combination of the data signals input through the at least one data input pad may be generated by connecting all or some of the data input pads to a predetermined power supply voltage or a predetermined ground voltage of the module.

BRIEF DESCRIPTION OF THE DRAWINGS

The above and other features and advantages of the present invention will become more apparent from the following detailed description of example embodiments thereof with reference to the accompanying drawings, in which:

FIG. 4 is a table illustrating an operation mode determination based on states of data pins according to an example embodiment of the present invention;

DETAILED DESCRIPTION

Hereinafter, example embodiments of the present invention will be described in detail with reference to the accompanying drawings.

Figure 2:
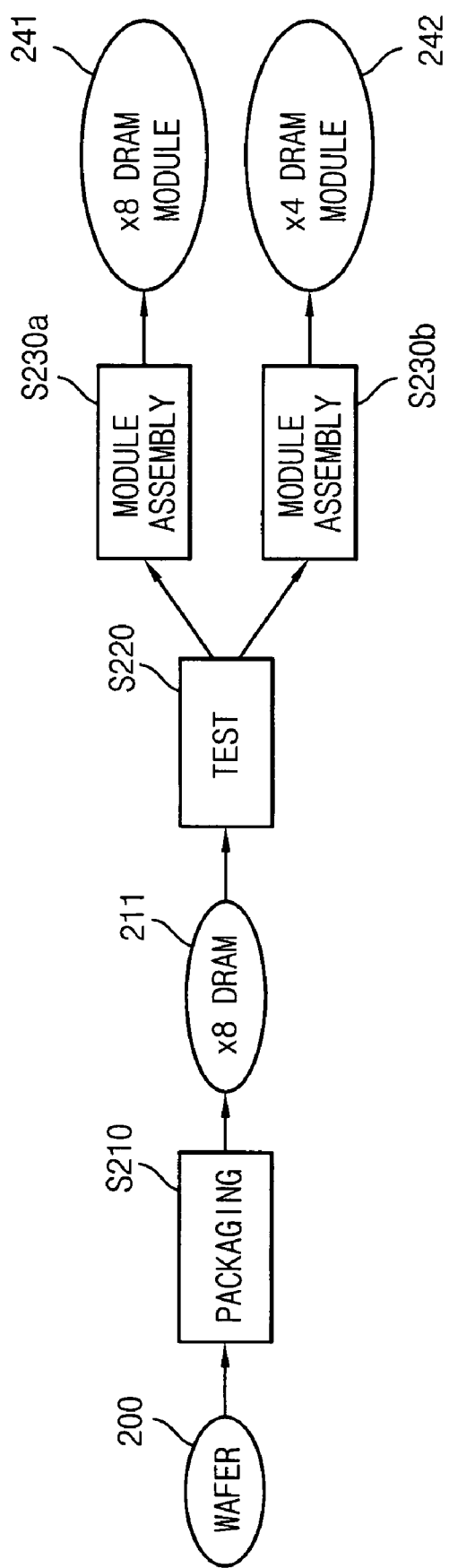
FIG. 2 is a process flow diagram illustrating a manufacturing process of x8 and x4 semiconductor memory devices according to an example embodiment of the present invention.

FIG. 2 is a process flow diagram illustrating a manufacturing process of x8 and x4 semiconductor memory devices according to an example embodiment of the present invention.

Figure 1:
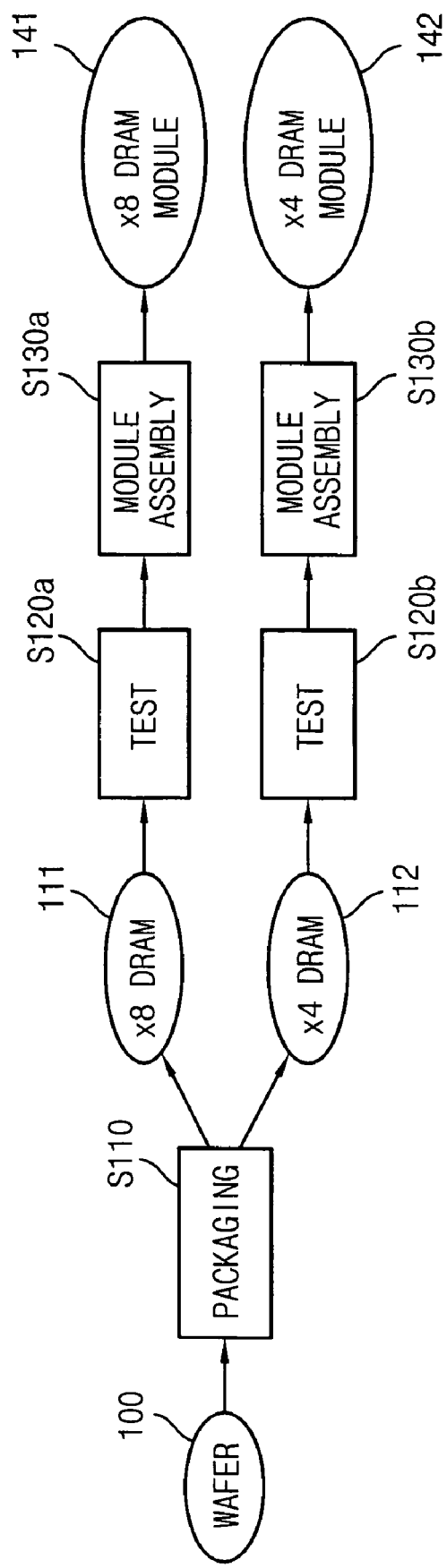
FIG. 1 is a process flow diagram illustrating a manufacturing process of conventional semiconductor memory devices with x8 and x4 organizations.

Referring to FIG. 2, similar to the manufacturing process of FIG. 1, semiconductor memory devices are all manufactured in an x8 organization at a wafer level 200. That is, the semiconductor memory devices are manufactured in the x8 organization at the wafer level 200 without differentiating between x4 and x8 organizations.

According to the prior art of FIG. 1, through the packaging step S110, the semiconductor memory devices are classified into x8 memory devices 111 and x4 memory devices 112 by pad bonding.

In contrast, according to an example embodiment of the present invention, the semiconductor memory devices exist in the x8 organization even after a packaging step S210. That is, the semiconductor memory devices are packaged in the x8 organization.

According to the prior art, the x8 memory devices and the x4 memory devices are separately packaged, tested in the separately packaged states (steps S120a and S120b), and assembled in the modules (steps S130a and S130b). In contrast, according to an example embodiment of the present invention, in step S220, the respective semiconductor memory devices are tested all together in the x8 organization.

In module assembly steps S230a and S230b, it is determined whether the semiconductor memory device will operate as the x8 memory device or the x4 memory device. Because the operation mode is determined in the final step, the module assembly step, the common manufacturing processes can be used in all preceding steps.

In order for the manufacturing processes to be carried out as described in FIG. 2, in a system employing the memory module, the operation mode of the semiconductor memory device is determined by the final module assembly state of the semiconductor memory device when there exists no information defining the operation mode of the semiconductor memory device embedded in the memory module.

For this purpose, when a Mode Register Set (MRS) command is input, states of predetermined data pins among eight data pins of the semiconductor memory device in the x8 organization are read, and the semiconductor memory device is enabled to operate in the x4 mode when the state of the predetermined data pins corresponds to a specific combination.

Although semiconductor memory devices capable of automatically switching the operation mode into the x4 mode and the x8 mode have been described, it is apparent to those skilled in the art that example embodiments of the present invention can also be applied to semiconductor memory devices capable of automatically switching the operation mode into more than two operation modes. For example, the present invention may be applied to an x16 semiconductor memory device operating in one of x4, x8 and x16 modes through an automatic mode switching.

Figure 3A:
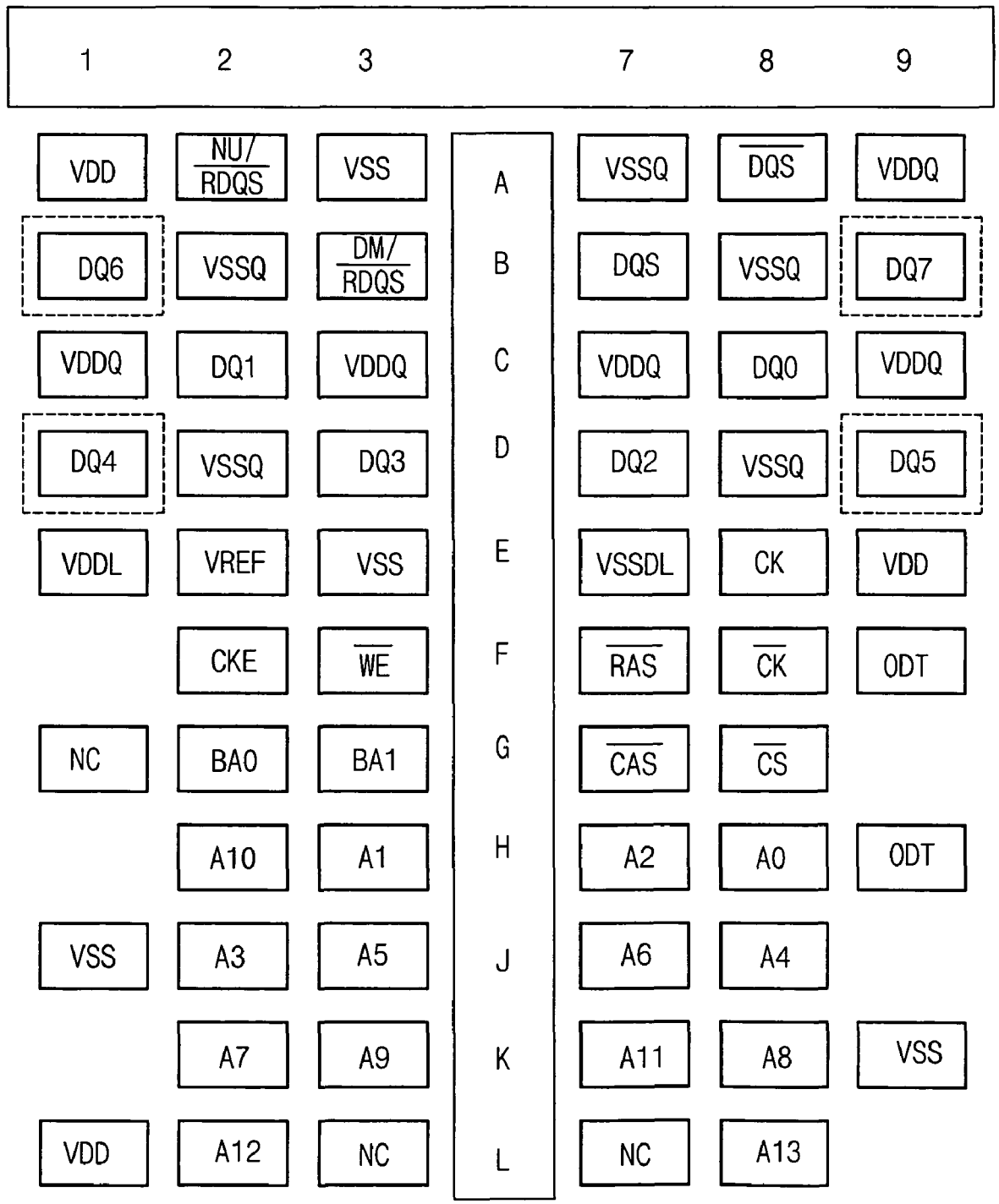
FIG. 3A is a diagram illustrating a pin-out configuration of a 512 Mbit x8 DDR2 DRAM.
Figure 3B:
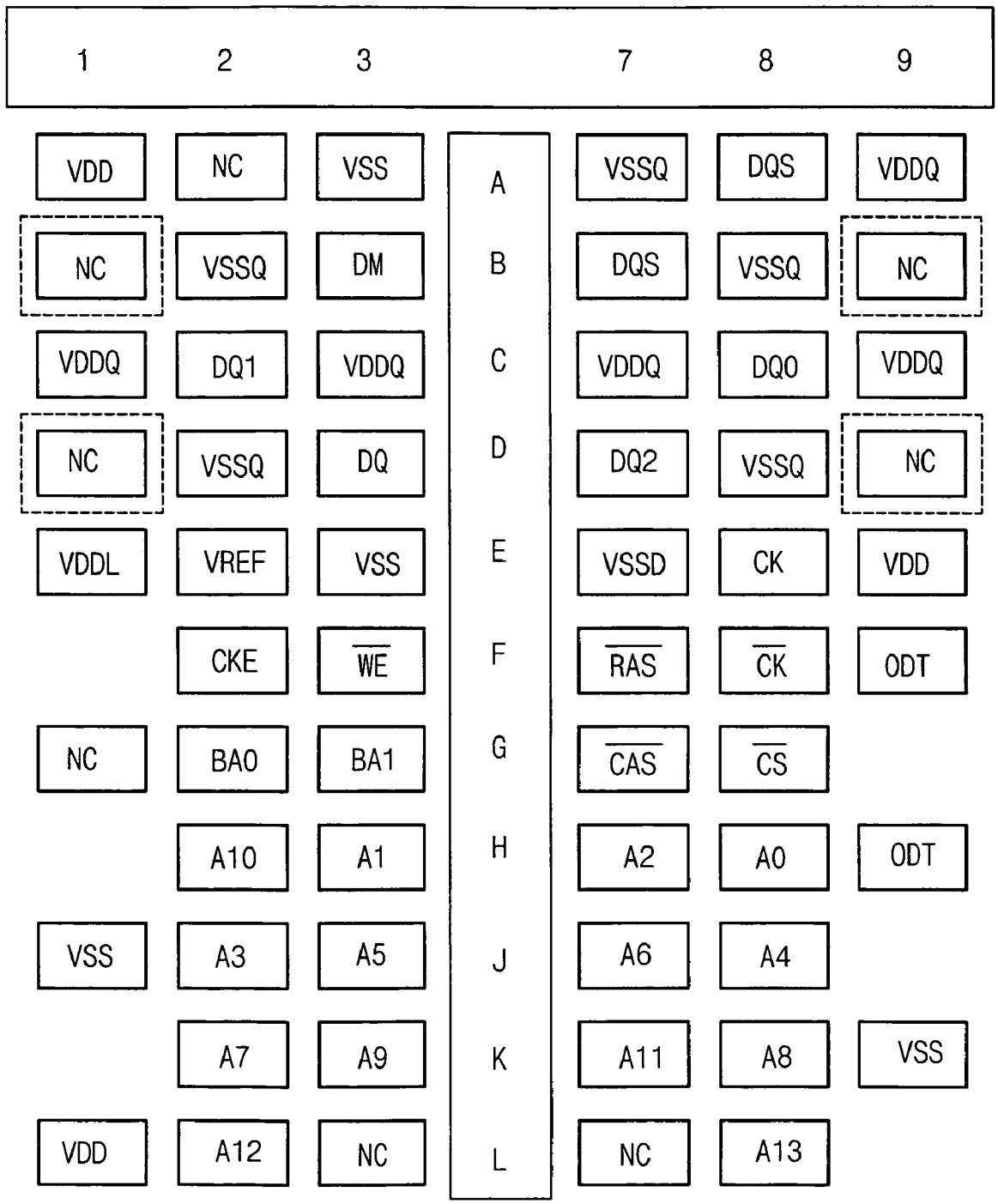
FIG. 3B is a diagram illustrating a pin-out configuration of a 512 Mbit x4 DDR2 DRAM.

FIG. 3A is a diagram illustrating a pin-out configuration of a 512 Mbit x8 double data rate 2 (DDR2) DRAM, and FIG. 3B is a diagram illustrating a pin-out configuration of a 512 Mbit x4 DDR2 DRAM.

FIGS. 3A and 3B illustrate the pin-out configurations of the x8 DDR2 DRAM 300 and the x4 DDR2 DRAM 350 packaged in a Fine-pitch Ball Grid Array (FBGA) type with sixty balls, respectively. Each pin is designated by an alphabetic designation of a row and a number of a column. For example, a pin A1 of FIG. 3A is assigned to a power supply voltage VDD.

Each of the x8 DRAM 300 and the x4 DRAM 350 illustrated in FIGS. 3A and 3B has fourteen address pins, eight data pins, control signal pins, and power pins.

Pins B1, B9, D1 and D9 of the x8 DRAM 300 of FIG. 3A are used as data pins DQ4 to DQ7, while pins B1, B9, D1 and D9 of the x4 DRAM 350 of FIG. 3B have no connection (NC). That is, all of the pins B1, B9, D1 and D9 of the x8 DRAM 300 of FIG. 3A are connected to data input/output taps on a module PCB, while the pins of B1, B9, D1 and D9 of the x4 DRAM 350 of FIG. 3B are treated as NC pins.

According to the prior art, the x8 DRAM 300 and the x4 DRAM 350 are differentiated in the packaged state, so that the pins except for the four pins B1, B9, D1 and D9 are designed with the same configuration and positions. According to an example embodiment of the present invention, the semiconductor memory devices are consistently manufactured into the x8 DRAM until the packaging operation as already described with respect to FIG. 2. The operation mode of the semiconductor memory device is determined by connecting predetermined data pins in a specific state during mounting the semiconductor memory devices on the module PCB, thereby attaining generality of the semiconductor memory device.

To achieve the above objects, an example embodiment of the present invention may provide a semiconductor memory device that can be switched into the x8 DRAM or the x4 DRAM according to the states of the predetermined data pins among the data pins of the semiconductor memory device when the MRS command is input.

A configuration of a semiconductor memory device, such as a DRAM, is next described, in which whether the semiconductor memory device operates as the x8 DRAM or as the x4 DRAM is determined based on the connection of the pins B1, B9, D1 and D9 of the x8 DRAM 300 to the module PCB.

FIG. 4 is a table illustrating an operation mode determination based on the connection states of the selected data pins according to an example embodiment of the present invention.

When the semiconductor memory device packaged in the x8 DRAM operates as the x8 DRAM, the pins B1, B9, D1 and D9 are connected to the data input taps DQ6, DQ7, DQ4 and DQ5 of the module.

In contrast, when the semiconductor memory device packaged in the x4 DRAM operates as the x4 DRAM, the pins B1, B9, D1 and D9 are connected to a power supply voltage VDD or a ground voltage GND according to a predetermined combination thereof.

A first row 410 of the table illustrated in FIG. 4 represents the pins B1, B9, D1 and D9. A second row 420 of the table illustrated in FIG. 4 represents the connection states of the pins B1, B9, D1 and D9 of the semiconductor memory device operating as the x4 DRAM. The pins B1 and D1 are connected to the power supply voltage VDD and the pins B9 and D9 are connected to the ground voltage GND, and thus maintaining at a high state and a low state, respectively.

As illustrated in FIG. 4, When the MRS command is input to the semiconductor memory device, the logic states of the pins B1, B9, D1 and D9 are read from the semiconductor memory device. If the read logic states of the pins B1, B9, D1 and D9 are respectively a logic high state, a logic low state, a logic high state, and a logic low state, the semiconductor memory device is switched to operate as the x4 DRAM.

A third row 430 of the table illustrated in FIG. 4 represents the connection states of the pins B1, B9, D1 and D9 of the semiconductor memory device operating as the x8 DRAM. The pins B1, B9, D1 and D9 are connected to the data input/output taps DQ6, DQ7, DQ4 and DQ5, respectively. This configuration corresponds to a general connection associated with a normal module of the x8 DRAM. In this case, the semiconductor memory device normally operates as the x8 DRAM.

Thus, the operation mode of the semiconductor memory device is determined based on the connection states of the predetermined data pins among the data pins.

However, in the initial state in which the data pins for determining the operation mode are not connected to the power supply voltage nor to the ground voltage, namely, the data pins are connected to the data input/output taps of the module so as to enable the semiconductor memory device to operate as the x8 DRAM, the state combination of the data pins may incidentally occur as the high state, the low state, the high state, and the low state due to influence of noise and interference.

Therefore, it is desirable that the states of the data pins for determining the operation mode be read every time when the MRS command is repeatedly input and the operation mode is switched when the states of the data pins continuously correspond to a predetermined combination over a certain time period to ensure a reliable switching of the operation mode.

For example, it may be reliable that the operation mode is switched only when the predetermined combination of the states of the data pins, which are read in response to every MRS command, is repeated more than predetermined threshold number of times.

For this purpose, the semiconductor memory device may further include a counter. Every time when the MRS command is input, the states of the data pins for determining the operation mode of the semiconductor memory device are read and a count value of the counter is increased when the read states of the data pins correspond to a predetermined combination.

When the count value of the counter is more than a predetermined threshold value, the operation mode is switched. In this manner, erroneous operations due to noise and interference may be prevented and the semiconductor memory device may be operated stably.

The MRS (Mode Register Set) needs not be a specific MRS designated specially for the object of the present invention, but may include all types of MRSs prepared in the semiconductor memory device or a subset of the MRSs prepared in the semiconductor memory device. The above switching operation may be performed when receiving an MRS command for determining several operation parameters of the semiconductor memory device in the initial state, for example, an MRS command input for determining a clock latency (CL).

Although the above example embodiments demonstrate determining the operation mode of the x8 DRAM (to the x4 mode or the x8 mode) in the module assembly step, it is apparent that its expansion is possible. For example, a semiconductor memory device with an x16 organization may be enabled to operate as an x8 organization, when data signals input through eight data pins except for other eight data pins required for the x8 operation mode correspond to a specific signal combination. In addition, a semiconductor memory device with an x16 organization may be enabled to operate as an x4 organization, when data signals input through twelve data pins except for other four data pins required for the x4 operation mode correspond to a specific signal combination.

As described above, in case that the specific signal combination is transmitted through the eight data pins, it can be configured with a high state, a low state, a high state, a low state, a high state, a low state, a high state, and a low state. In case that the specific signal combination is transmitted through the twelve data pins, it can be configured with additional states of the four data pins, those are, a high state, a low state, a high state, and a low state, in addition to the signal combination of the previous case.

Figure 5:
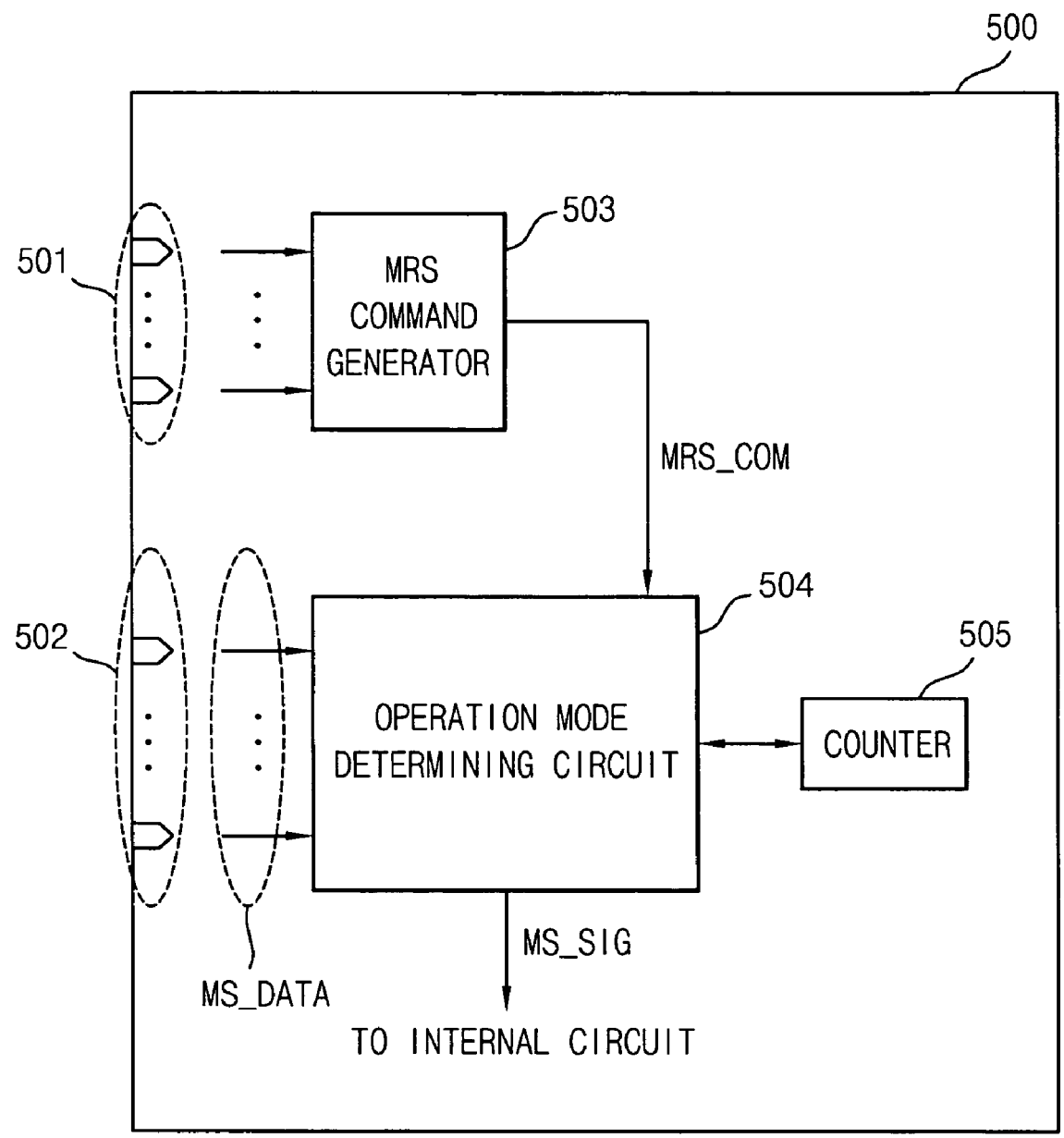
FIG. 5 is a block diagram of a semiconductor memory device according to an example embodiment of the present invention.

FIG. 5 is a block diagram of a semiconductor memory device according to an example embodiment of the present invention.

Referring to FIG. 5, the semiconductor memory device 500 includes MRS input pads 501 for receiving MRS commands, and data input pads 502 for receiving data signals.

The MRS input pads 501 are not limited to MRS input use, but can be used as a combination of diverse control signal input pads that are variously configured according to the structure of the semiconductor memory device 500. Accordingly, an MRS command generator 503 generates an MRS command MRS_COM based on the combination of signals input at the MRS input pads 501.

An operation mode determining circuit 504 of the semiconductor memory device 500 receives the MRS command MRS_COM and data signals MS_DATA input through all or partial of the data input pads 502.

The operation mode determining circuit 504 generates an operation mode determining signal MS_SIG for determining the operation mode when the MRS command MRS_COM corresponds to a predetermined MRS command and the input data signals MS_DATA correspond to a predetermined combination. The operation mode determining signal MS_SIG is transmitted to an internal circuit of the semiconductor memory device 500 and determines the operation mode of the semiconductor memory device 500.

In addition, the semiconductor memory device 500 can further include a counter 505. The counter 505 increments a count value based upon detection that the MRS command MRS_COM corresponds to the predetermined MRS command and the input data signals MS_DATA correspond to the predetermined combination. The operation mode determining circuit 504 may be configured to generate the operation mode determining signal MS_SIG when the count value of the counter 505 reaches a predetermined threshold value.

Figure 6:
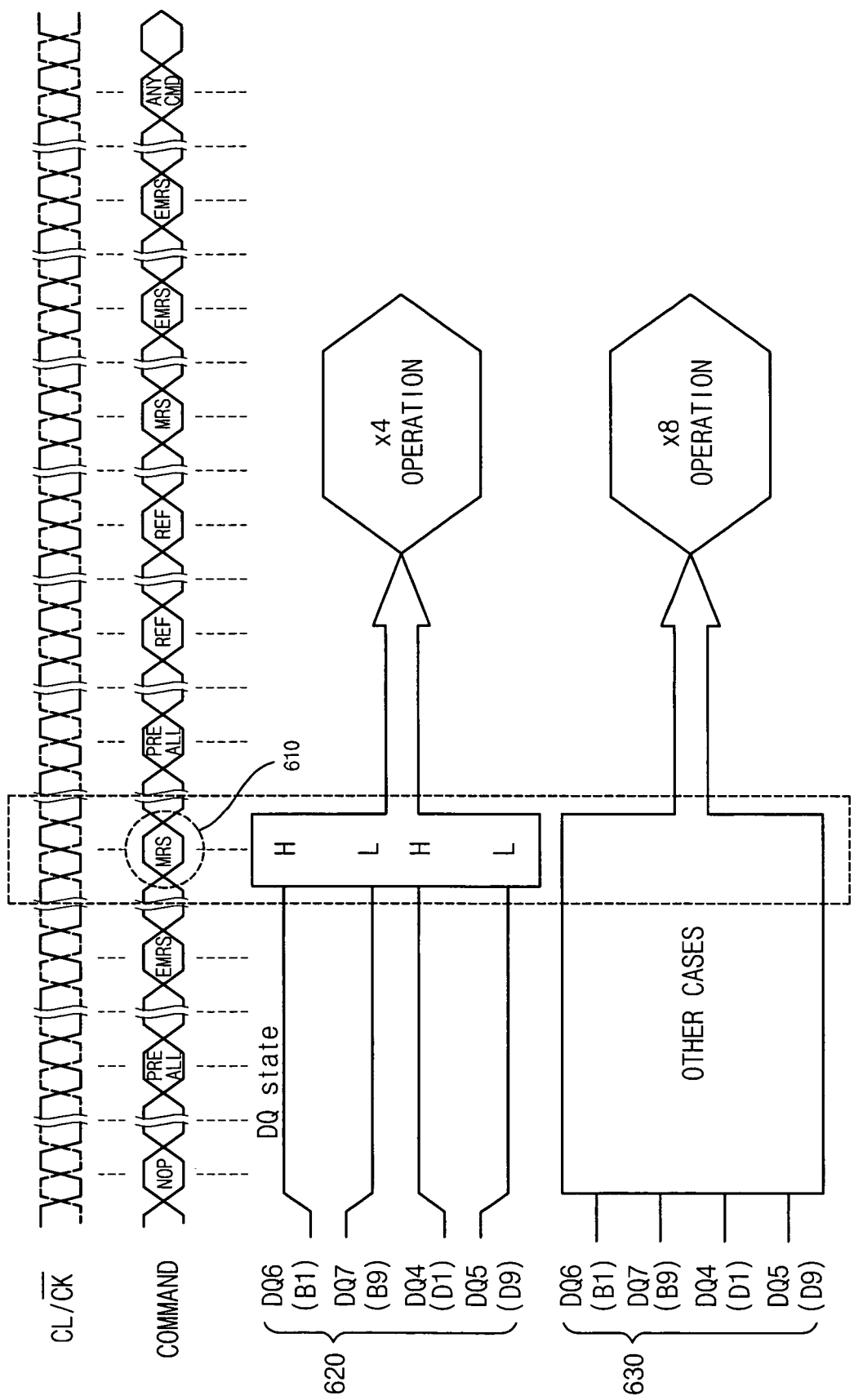
FIG. 6 is a timing diagram illustrating an operation of determining an operation mode of a semiconductor memory device according to an example embodiment of the present invention.

FIG. 6 is a timing diagram illustrating an operation of determining the operation mode of the semiconductor memory device according to an example embodiment of the present invention.

In FIG. 6, CK and /CK represent clocks for the semiconductor memory device according to the present invention. COMMAND represents an input command for the semiconductor memory device according to an example embodiment of the present invention.

In addition, FIG. 6 illustrates data signals input to four data pins B1, B9, D1 and D9 in order to determine whether to operate the semiconductor memory device as the x8 DRAM or the x4 DRAM.

The operation mode of the semiconductor memory device is determined at a time point 610 when the MRS command is input.

As described above, the MRS need not be a specific MRS designated specially for the object of the present invention, but can be all or part of MRSs for determining operation parameters of the semiconductor memory device. For example, the operation of determining the operating mode may be performed in response to an MRS command for determining a clock latency input during powering up the system.

When the semiconductor memory device is determined to operate as the x4 DRAM (a case 620), the pins B1, B9, D1 and D9 are connected to the power supply voltage or the ground voltage at the time point 610 when the MRS command is input, so that a logic high signal, a logic low signal, a logic high signal, and a logic low signal are applied to the pins B1, B9, D1 and D9. Thus, the semiconductor memory device is switched to operate in the x4 operation mode.

As described above, in the initial state in which the data pins for determining the operation mode are not connected to the power supply voltage nor to the ground voltage, the state combination of the high state, the low state, the high state, and the low state may incidentally occur due to influence of noise and interference.

Accordingly, instead of immediately determining the operation mode at the time point 610 when the MRS command is input, the states of the data pins for determining the operation mode are read at every input of the MRS command, and then the operation mode is switched only when the states of the data pins continuously correspond to a predetermined combination over a certain time period.

For example, counter 505 may be provided, and the states of the data pins for determining the operation mode are read every time the MRS command is input. A count value of the counter is increased when the read states of the data pins correspond to a predetermined combination. Then, the operation mode is switched when the count value reaches a predetermined threshold value. In such a manner, a stable operation of the semiconductor memory device may be achieved.

In the case that the semiconductor memory device is determined to operate as the x8 DRAM (a case 630), the pins B1, B9, D1 and D9 are connected to the data input/output taps at the time point 610 when the MRS command is input, so that a signal combination other than the above combination of the high state, the low state, the high state, and the low state is input. Accordingly, the semiconductor memory device operates as the x8 DRAM.

Figure 7A:
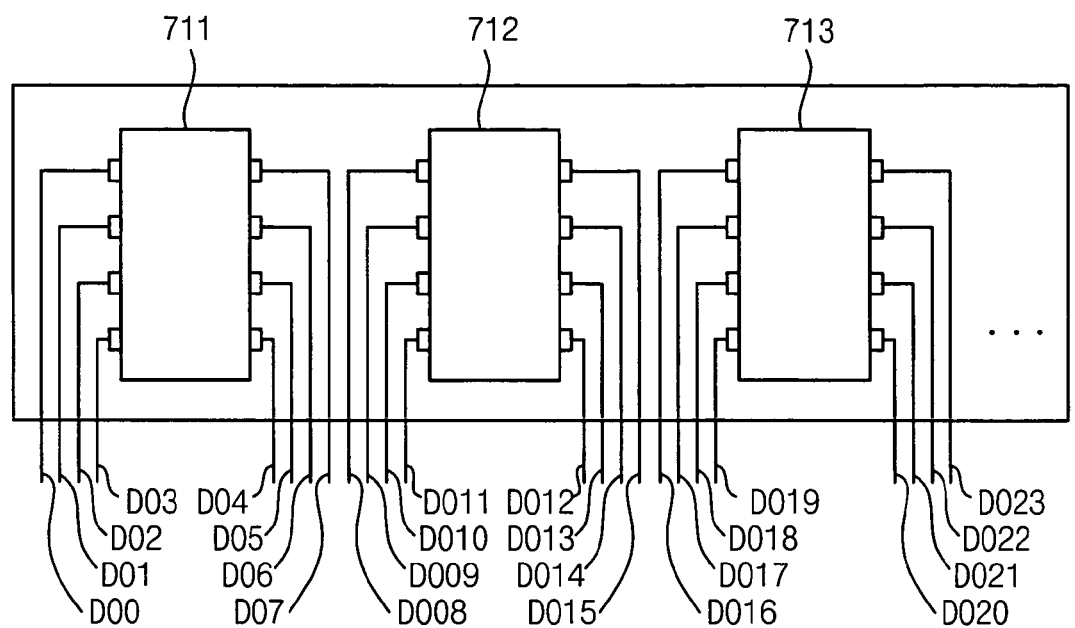
FIG. 7A is a schematic block diagram of an x64 DIMM module in case the semiconductor memory device according to an example embodiment of the present invention is operated as an x8 semiconductor memory device.
Figure 7B:
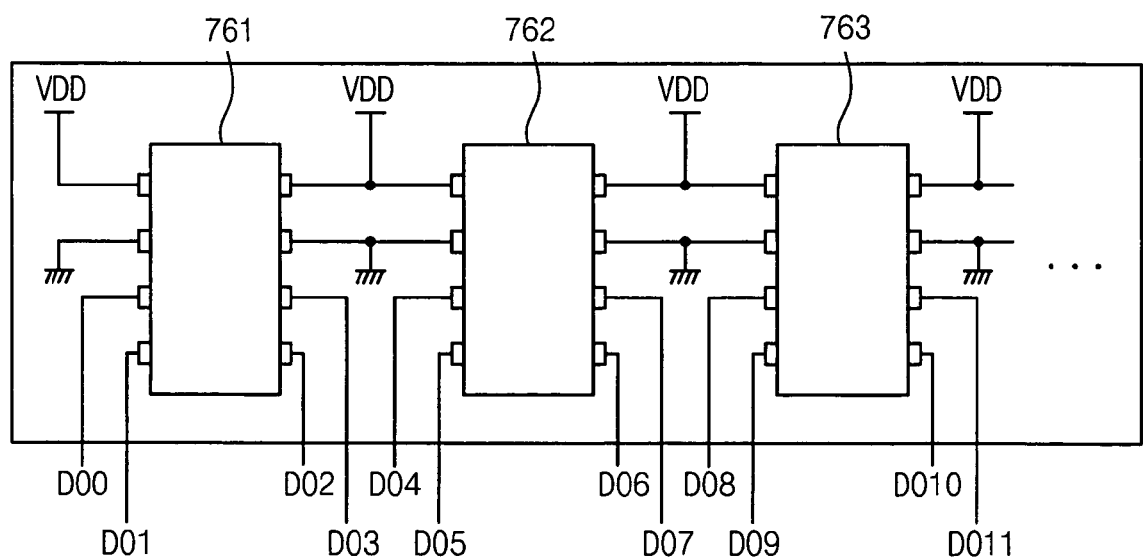
FIG. 7B is a schematic block diagram of an x64 DIMM module in case the semiconductor memory device according to an example embodiment of the present invention is operated as an x4 semiconductor memory device.

FIGS. 7A and 7B are schematic block diagrams illustrating configurations of modules using the semiconductor memory device according to an example embodiment of the present invention.

FIG. 7A is a schematic block diagram of an x64 DIMM module 700 in the case in which the semiconductor memory device is operated as an x8 DRAM.

In order to form an x64 bandwidth of the module 700, eight x8 DRAMs 711, 712, 713, ..., are used and eight data pins of the DRAM 711 are connected to data input/output taps D00 to D07 of the module 700. Similarly, eight data pins of the DRAM 712 are connected to data input/output taps D08 to D15 of the module 700, and the DRAM 713 to data input/output taps D6 to D23. Similarly, the remaining five DRAMs (omitted in FIG. 7A) are also connected to data input/output taps D24 to D63 of the module.

FIG. 7B is a schematic block diagram of an x64 DIMM module 750 in the case in which the semiconductor memory device is operated as an x4 DRAM.

In order to form an x64 bandwidth of the module 750, sixteen x4 DRAMs 761, 762, 763, ..., are used and four data pins of the DRAM 761 are connected to data input/output taps D00 to D03 of the module 750. However, the remaining four data pins B1, B9, D1 and D9 of the DRAM 761 are connected to the power supply voltage VDD or the ground voltage GND of the module 750.

Similarly, four data pins of the DRAM 762 are connected to data input/output taps D04 to D07 of the module, while the remaining four data pins B1, B9, D1 and D9 of the DRAM 762 are connected to the power supply voltage VDD or the ground voltage GND of the module 750. In addition, the DRAM 763 has the same configuration. Likewise, the remaining thirteen DRAMs (omitted in FIG. 7B) are also connected in the same manner.

Because a 168-pin DIMM module has an x64 organization at the module level, sixteen x4 DRAMs or eight x8 DRAMs are mounted on one module. As described above with respect to the related art, one module may have an x72 organization at the module level alternatively, while additional eight bits of the x72 DIMM are used to control data buses and check partial bit error. When the x72 DIMM is used, nine x8 DRAMs and eighteen x4 DRAMs are mounted on the module.

According to the example embodiments of the present invention, the semiconductor memory device is capable of determining the operation mode by using the MRS signals and the data signals, and the operation method for the same. The efficiency in the manufacturing and producing processes can be improved by determining the operation mode merely through the connection of the semiconductor memory device and the module PCB in the module assembly process.

While the present invention has been described with respect to the particular embodiments, it will be apparent to those skilled in the art that various changes and modifications may be made without departing from the spirit and scope of the invention as defined in the following claims.

What is claimed is:

1. A semiconductor memory device comprising:
at least one mode register set (MRS) input pad;
at least one data input pad; and
an operation mode determining circuit configured to generate an operation mode determining signal based on an MRS command input through the MRS input pad and a plurality of data signals input to the operation mode determining circuit through the at least one data input pad,
wherein when the input MRS command corresponds to a predetermined MRS command and the plurality of input data signals include a predetermined combination, the operation mode determining circuit generates the operation mode determining signal for determining an operation mode of the semiconductor memory device that represents a number of memory cells simultaneously selected by a single address, the operation mode being determined by connecting predetermined data input pads in a specific state during mounting of the semiconductor memory device on a module PCB,
an independent and variable number of the number of memory cells are simultaneously selected according to the operation mode, and
the semiconductor memory device includes 2N number of data input pads (where N is a positive integer), and the operation mode of the semiconductor memory device is one of x1 to x2M operation modes (where M is a positive integer less than or equal to N).

2. The semiconductor memory device of claim 1, wherein the predetermined MRS command includes any types of typical MRS commands provided to the semiconductor memory device, or a part of the MRS commands.

3. The semiconductor memory device of claim 1, wherein the operation mode determining circuit receives data signals input through the at least one data input pad except for 2P (where P is a positive integer less than N) data input pads necessary for an X2P operation mode among the 2N number of the data input pads to generate the operation mode determining signal for determining whether the operation mode of the semiconductor memory device is the x2P operation mode, when the input data signals include the predetermined combination.

4. The semiconductor memory device of claim 3, wherein N is 3.

5. The semiconductor memory device of claim 4, wherein the predetermined combination of the data signals includes data signals, which are input to four data input pads among the eight data input pads, respectively having a logic high state, a logic low state, a logic high state, and a logic low state.

6. A semiconductor memory device comprises:
at least one mode register set (MRS) input pad configured to receive an MRS command;
at least one data input pad configured to receive a plurality of data signals;
a counter; and
an operation mode determining circuit configured to generate an operation mode determining signal based on an MRS command input through the MRS input pad and a the plurality of data signals input to the operation mode determining circuit through the at least one data input pad,
wherein when the input MRS command corresponds to a predetermined MRS command and the plurality of input data signals include a predetermined combination, the operation mode determining circuit increments a count value of the counter, and generates the operation mode determining signal for determining an operation mode of the semiconductor memory device that represents a number of memory cells simultaneously selected by a single address when the count value of the counter reaches a predetermined threshold value, the operation mode being determined by connecting predetermined data input pads in a specific state during mounting of the semiconductor memory device on a module PCB,
an independent and variable number of the number of memory cells are simultaneously selected according to the operation mode, and
the semiconductor memory device includes 2N number of data input pads (where N is a positive integer), and the operation mode of the semiconductor memory device is one of x1 to x2M operation modes (where M is a positive integer less than or equal to N).

7. The semiconductor memory device of claim 6, wherein the predetermined MRS command includes any types of typical MRS commands provided to the semiconductor memory device, or a part of the MRS commands.

8. A method of determining an operation mode of a semiconductor memory device, comprising:
receiving a mode register set (MRS) command;
receiving a plurality of data signals through at least one data input pad;
determining whether the received MRS command corresponds to a predetermined MRS command;
determining whether the received data signals include a predetermined combination when the received MRS command corresponds to the predetermined MRS command; and
determining an operation mode of the semiconductor memory device that represents a number of memory cells simultaneously selected by a single address when the received data signals include the predetermined combination, the operation mode being determined by connecting predetermined data input pads in a specific state during mounting of the semiconductor memory device on a module PCB,
wherein an independent and variable number of the number of memory cells are simultaneously selected according to the operation mode, and
the semiconductor memory device includes 2N number of data input pads (where N is a positive integer), and the operation mode of the semiconductor memory device is of x1 to x2M operation modes (where M is a positive integer less than or equal to N).

9. The method of claim 8, wherein the predetermined MRS command includes any types of MRS commands provided to the semiconductor memory device, or a part of the MRS commands.

10. The method of claim 8, wherein whether the operation mode of the semiconductor memory device is x2P (where P is a positive integer less than N) operation mode is determined by a predetermined combination of data signals input through the at least one data input pad except for 2P number of the data input pads necessary for the x2P operation mode among the 2N number of the data input pads.

11. The method of claim 8 wherein the positive integer N is 3.

12. The method of claim 11, wherein the predetermined combination of the data signals includes data signals, which are input to four data input pads among the eight data input pads, respectively having a logic high state, a logic low state, a logic high state and an logic low state.

13. A method of determining an operation mode of a semiconductor memory device, comprising:
receiving a mode register set (MRS) command;
receiving a plurality of data signals through at least one data input pad;
determining whether the received MRS command corresponds to a predetermined MRS command;
determining whether the received data signals include a predetermined combination when the input MRS command corresponds to the predetermined MRS command;
incrementing a count value of a counter when the received data signals include the predetermined combination; and
determining an operation mode of the semiconductor memory device that represents a number of memory cells simultaneously selected by a single address when the count value of the counter reaches a predetermined threshold value, the operation mode being determined by connecting predetermined data input pads in a specific state during mounting of the semiconductor memory device on a module PCB,
wherein an independent and variable number of the number of memory cells are simultaneously selected according to the operation mode, and the semiconductor memory device includes 2N number of data input pads (where N is a positive integer), and the operation mode of the semiconductor memory device is one of x1 to x2M operation modes (where M is a positive integer less than or equal to N).

14. A semiconductor memory module comprising:
a module PCB; and
a semiconductor memory device, comprising:
at least one mode register set (MRS) input pad;
at least one data input pad; and
an operation mode determining circuit configured to generate an operation mode determining signal based on a MRS command input through the MRS input pad and a plurality of data signals input to the operation mode determining circuit through the at least one data input pads,
wherein when the input MRS command corresponds to a predetermined MRS command and the plurality of input data signals include a predetermined combination, the operation mode determining circuit generates the operation mode determining signal for determining an operation mode of the semiconductor memory device that represents a number of memory cells simultaneously selected by a single address, the operation mode being determined by connecting predetermined data input pads in a specific state during mounting of the semiconductor memory device on the module PCB,
an independent and variable number of the number of memory cells are simultaneously selected according to the operation mode, and
the semiconductor memory device includes 2N number of data input pads (where N is a positive integer), and the operation mode of the semiconductor memory device is one of x1 to x2M operation modes (where M is a positive integer less than or equal to N).

15. The semiconductor memory module of claim 14, wherein the predetermined combination of the data signals is generated by connecting the at least one data input pad to a predetermined power supply voltage or a predetermined ground voltage of the module to set a logical state of the data input pad to a one or zero.

16. The semiconductor memory module of claim 14, wherein the predetermined MRS command received by the semiconductor memory device includes any types of MRS commands provided to the semiconductor memory device, or a part of the MRS commands.

17. The semiconductor memory module of claim 14, wherein the semiconductor memory module has one of an x64 organization and an x72 organization.

18. A semiconductor memory module comprising:
a module PCB; and
a semiconductor memory device, comprising:
at least one mode register set (MRS) input pad configured to receive an MRS command;
at least one data input pad configured to receive a plurality of data signals;
a counter; and
an operation mode determining circuit configured to generate an operation mode determining signal based on an MRS command input through the MRS input pad and the plurality of data signals input to the operation mode determining circuit through the at least one data input pad,
wherein when the input MRS command corresponds to a predetermined MRS command and the plurality of input data signals include a predetermined combination, the operation mode determining circuit increments a count value of the counter, and generates the operation mode determining signal for determining an operation mode of the semiconductor memory device that represent a number of memory cells simultaneously selected by a single address when the count value of the counter reaches a predetermined threshold value, the operation mode being determined by connecting predetermined data input pads in a specific state during mounting of the semiconductor memory device on the module PCB,
an independent and variable number of the number of memory cells are simultaneously selected according to the operation mode, and
the semiconductor memory device includes 2N number of data input pads (where N is a positive integer), and the operation mode of the semiconductor memory device is one of x1 to x2M operation modes (where M is a positive integer less than or equal to N).

* * * * *